United States Patent
Ayala et al.

(10) Patent No.: US 9,780,062 B2
(45) Date of Patent: *Oct. 3, 2017

(54) METHOD OF MANUFACTURING A FUNCTIONAL INLAY

(71) Applicant: ASSA ABLOY AB, Stockholm (SE)

(72) Inventors: Stephane Ayala, Oron-la-Ville (CH); Urs Furter, Noville (CH); Laurent Pellanda, Essertines-sur-Rolle (CH)

(73) Assignee: ASSA ABLOY AB, Stockholm (SE)

( * ) Notice: Subject to any disclaimer, the term of this patent is extended or adjusted under 35 U.S.C. 154(b) by 0 days.

This patent is subject to a terminal disclaimer.

(21) Appl. No.: 15/269,464

(22) Filed: Sep. 19, 2016

(65) Prior Publication Data

US 2017/0005066 A1   Jan. 5, 2017

Related U.S. Application Data

(63) Continuation of application No. 14/413,801, filed as application No. PCT/EP2012/063671 on Jul. 12, 2012, now Pat. No. 9,501,733.

(51) Int. Cl.
*G06K 19/06* (2006.01)
*H01L 23/00* (2006.01)
(Continued)

(52) U.S. Cl.
CPC ........ *H01L 24/78* (2013.01); *G06K 19/07754* (2013.01); *G06K 19/07773* (2013.01); *G06K 19/07779* (2013.01); *H01L 21/4889* (2013.01); *H01L 23/49855* (2013.01); *H01L 24/75* (2013.01); *H01L 25/50* (2013.01); *H01Q 1/2225* (2013.01); *H01L 24/81* (2013.01); *H01L 2224/753* (2013.01); *H01L 2224/7565* (2013.01); *H01L 2224/7598* (2013.01); *H01L 2224/75301* (2013.01); *H01L 2224/75745* (2013.01); *H01L 2224/75801* (2013.01); *H01L 2224/75841* (2013.01);
(Continued)

(58) Field of Classification Search
CPC . H01L 2224/75745; H01L 2224/75801; H01L 2224/81203; H01L 2224/81385; G06K 19/07722; G06K 19/07754; G06K 19/07747; G06K 19/07794; G06K 19/07773; G06K 19/07779; H01Q 1/2225
USPC .................................................. 235/492, 488
See application file for complete search history.

(56) References Cited

U.S. PATENT DOCUMENTS 4,762,267 A * 8/1988 Shimizu ............... B23K 20/005
228/180.5
5,731,244 A * 3/1998 Evers .................. H01L 21/4825
257/E21.517
(Continued)

*Primary Examiner* — Thien M Le
(74) *Attorney, Agent, or Firm* — Sheridan Ross P.C.

(57) ABSTRACT

The method of manufacturing a functional inlay comprises the steps of:
a support layer with at least a first and a second side
a wire antenna in said support layer
processing said support layer with said embedded wire antenna to a connection station in which
said support layer is approached on said first side by a holding device holding a chip with a surface comprising connection pads;
said support layer is approached on said second side by a connection device; and
said antenna wire is connected to said connection pads by means of a reciprocal pressure exerted between said holding device and said connection device.

19 Claims, 8 Drawing Sheets

(51) Int. Cl.
*G06K 19/077* (2006.01)
*H01L 23/498* (2006.01)
*H01Q 1/22* (2006.01)
*H01L 21/48* (2006.01)
*H01L 25/00* (2006.01)

(52) U.S. Cl.
CPC .............. *H01L 2224/787* (2013.01); *H01L 2224/78102* (2013.01); *H01L 2224/81191* (2013.01); *H01L 2224/81203* (2013.01); *H01L 2224/81385* (2013.01); *H01L 2224/97* (2013.01); *H01L 2924/15153* (2013.01)

(56) References Cited

U.S. PATENT DOCUMENTS

| | | | | |
|---|---|---|---|---|
| 6,097,089 | A * | 8/2000 | Gaku | H01L 21/481 |
| | | | | 257/675 |
| 6,242,802 | B1 * | 6/2001 | Miles | H01L 23/13 |
| | | | | 257/737 |
| 2003/0040142 | A1 * | 2/2003 | Lin | H01L 23/3114 |
| | | | | 438/118 |
| 2004/0238857 | A1 * | 12/2004 | Beroz | H01F 17/0033 |
| | | | | 257/232 |
| 2007/0018186 | A1 * | 1/2007 | Shin | H01L 33/22 |
| | | | | 257/98 |
| 2008/0191333 | A1 * | 8/2008 | Yang | H01L 21/6835 |
| | | | | 257/680 |

* cited by examiner

METHOD OF MANUFACTURING A FUNCTIONAL INLAY

CROSS REFERENCE TO RELATED APPLICATIONS

This application is a continuation application of U.S. patent application Ser. No. 14/413,801 filed Apr. 1, 2015 entitled "Method of Manufacturing a Functional Inlay," which was a national stage application under 35 U.S.C. 371 and claimed the benefit of PCT Application No. PCT/EP2012/063671 having an international filing date of Jul. 12, 2012, which designated the United States. The disclosures of each application are incorporated herein by reference in their entirety.

TECHNICAL FIELD

The present invention concerns the field of RFID devices comprising an antenna connected to a chip via direct bonding.

More specifically, the present invention concerns a method for direct bonding of a chip to a wire antenna which is embedded in a substrate to form a functional inlay.

The present invention also concerns a functional inlay produced with the method described herein.

BACKGROUND ART

U.S. Pat. No. 6,233,818 to Finn et al. discloses a method of manufacturing of a FID inlay. More specifically, this patent discloses a process and device for the contacting of a wire conductor in the course of the manufacture of a transponder unit arranged on a substrate and comprising a wire coil and a chip unit such as a chip module with terminal areas. By virtue of the process according to the invention described in this prior art, there is no longer any necessity, with a view to bringing the terminal areas of the chip unit into contact with the ends of the coil, to provide a separate contact substrate on which enlarged terminal areas are formed. Rather, the coil substrate, which is used as substrate for the wire coil and which, for example in the case where the transponder unit is intended to serve for the manufacture of a chip card, is formed by means of a plastic support sheet corresponding to the dimensions of the chip card, serves as a contacting or positioning aid for the relative positioning of the ends of the coil in relation to the terminal areas of the chip unit. In this case the chip unit may either be arranged in a recess in the substrate provided for this purpose or may be provided on the surface of the substrate. The first alternative affords the possibility of arranging the chip unit in the recess optionally prior to fixation of the wire conductors or of introducing the chip unit into the recess only after fixation of the wire conductors, in order subsequently to implement the actual contacting of the wire conductors on the terminal areas.

More specifically, in this prior art, firstly an antenna is applied to the substrate via a wiring device using ultrasound to attach the wire to the substrate. An antenna is thereby formed with an initial antenna region and a final antenna region, both regions traversing a window shaped substrate recess. Then, a chip module is placed in the recess whereby terminal contact areas of the module abut the initial and terminal antenna regions. Subsequently, an electrical connection is realized between the terminal contact areas and the initial and final antenna regions of the antenna by means of a thermode which under the influence of pressure and temperature creates a connection by material closure between the wire antenna and the terminal contact areas of the chip (this is also called thermo compression).

EP patent application 2 001 077 discloses a method for producing a device comprising a transponder antenna connected to contact pads and a device obtained by said process. Specifically, an antenna with terminal connections is provided in contact with a substrate. Contact pads are placed on the substrate and connected to the terminal sections of the antenna. The connection is produced by means of a soldering by introducing energy between the pads and the terminal sections. The pads are placed such as to provide a surface facing an antenna terminal connection section. The section is arranged on the substrate and the soldering energy is directly applied to the pads. A cavity is produced in the substrate close to the antenna terminal sections and a microcircuit is inserted at least partly in the cavity with contact pads positioned facing the antenna terminal sections and a soldering is carried out using thermo-compression or ultrasound. To carry out this soldering step, an anvil is used that goes through a reinforcing sheet or layer opposite the terminal section to provide a support during the soldering operation. This thus imposes the creation of a hole for the anvil which has to be carefully placed to correspond to the position of the terminal section.

The inventions disclosed in the documents cited above relate all in fact (in the practice) to the use of chip modules. Per definition, chip modules are much larger than chips and also comprise much larger connection pads. A typical chip module for contactless inlay is the mob6 from NXP, presenting a surface area of 8100×5100 μm for a thickness of 300 μm, with connection pads having a surface area of 1500×5100 μm each.

U.S. Pat. No. 5,572,410 discloses a chip being directly connected to wire antenna. In this patent, a wire is wound around a core and the two ends of the wire are soldered to metal paths deposited over the active layer of the chip. This technology, which is called "direct bonding", minimizes the size of the resulting transponder, the number of its constituting elements as the related production costs.

The metal paths which are extensions of the usual small pads of the chips, are called megabumps (or megapads) and show a dimension adapted to the connection of the antenna wire (which shows typically a diameter of 60-80 μm). For example, a typical chip used for such applications is the Hitag μ from NXP, wherein the chip surface area is of 550×550 μm for 150 μm thickness and the megabump show a surface area of 294×164 μm (while the original pads are only 60×60 μm).

It also has to be noted that in the particular application disclosed in this document, the antenna is not embedded in a support layer, but wound around a ferrite core. The resulting transponder has a resonant frequency of about 125 kHz and the antenna show over 300 turns. This does not require a fine tuning of antenna, and the antenna spires are just wound one on the other at high speed.

However, if one wants to work at higher frequency, as for example 13.56 MHz, one will have to control the form and the relative spacing of each spire in order to tune the antenna correctly. Wire embedding is the most efficient and popular technology for manufacturing of high frequency wire antennas. But up to now, this was made exclusively by using chip modules. This introduces an important limitation as the resulting inlay cannot be thinner than the used module.

The manufacturing of thinner high frequency inlays is the main motivation to try to combine direct bonding and wire embedding technologies.

Table 1 propose a list of some of the high frequency chips on the market which could be used for direct bonding. These chips present much smaller dimensions (not only in thickness) in comparison to the mob6 from NXP described above.

TABLE 1 examples of high frequency chips applicable for direct bonding

| Supplier | Ref. | Chip dims [μm] | Chip thickness [μm] | Bumps dims [μm] | Bump thickness [μm] | Total thickness [μm] |
|---|---|---|---|---|---|---|
| EM | EM4233 | 1034 × 1054 | 100,200 or 280 | 300 × 400 | 18 | N/A |
| NXP | MF CLASSIC 1k | 650 × 675 | 150 | 164 × 294 | 18 | 168 |
| INSIDE | Picopass 2k V1.2 | 1198 × 1192 | 280 | 310 × 712 | 20 | 300 |
| NXP | P60D080/P60D144 VA | 2166 × 3004 | 75 | 600 × 600 | 12 | 87 |
| INSIDE | AT90SC28880RCFV | 2740 × 2970 | 75 | 600 × 680 | 12 | 87 |

The problem is to handle such small chips properly when in the same time the antenna wire is fixed on a huge sheet of plastic. Solutions used today for chip modules (which are much heavier and larger than single chips) are no more usable at such large manufacturing scale.

SUMMARY OF THE INVENTION

An aim of the present invention is to improve the known devices and methods.

More precisely, an aim of the present invention is to manufacture the thinner RFID inlay possible by direct bonding of a chip, such as a RFID chip, to an wire antenna that is embedded in a substrate.

In summary the invention allows getting a high frequency RFID monolayer thinner than the sum of the thickness of the chip plus the thickness of the antenna (chip and antenna being inside the carrier monolayer itself).

Other HF RFID technologies known in the art and using a naked chip as flip chip technology will be thicker due to the fact they need a carrier layer without holes where the antenna (etched antenna or screen printed antenna) will be put on. After this step, a chip is connected on the antenna and the final thickness will be the addition of the chip thickness+antenna thickness+carrier layer thickness. In this case, a carrier layer has to be added to the total thickness of the layer, a disadvantage that is not present anymore when using the principle of the invention as described in the present application.

According to one aspect, the invention is directed to a method of direct bonding an embedded wire antenna to a chip whereby the tooling allows at the same time to hold the chip from one side and to connect the antenna wires to said chip through a connection head, such as a welding head, from the other side.

More precisely, the method comprises at least the following steps:
providing a support layer with at least a first and a second side;
embedding at least one wire antenna in the support layer;
processing the support layer with said embedded wire antenna(s) to a connection station in which
the support layer is approached on the first side by a holding device holding at least one chip with a surface comprising connection pads;
the support layer is approached on the second side by a connection device; and
the antenna(s) wire is (are) connected to the connection pads by means of a reciprocal pressure exerted between the holding device and the connection device.

In the method, the support layer with the wire embedded antenna may be processed along a processing path and the holding device and the connection device both may approach the support layer by movements essentially perpendicular to said processing path.

In an embodiment of the method, the connection step may be achieved by thermo compression.

In an embodiment of the method, the support layer comprises at least one through hole in which a chip is positioned by the holding device during or shortly before the connection step.

In an embodiment of the method, connection portions of the wire antennas dedicated to be connected to the connection pads of the chip are positioned over the through hole(s).

In an embodiment of the method, the connection portions of the wire antenna are positioned over the through hole(s) during the during the wire antenna embedding step.

In an embodiment, the method may comprise an additional step to reposition the connection portions of the wire antenna(s) over the through hole(s) after the wire embedding step and before or during the connection step with a chip.

In an embodiment of the method, the connection portions undergo a flattening step before the connection step to a chip to provide a larger and substantially flat conductive area for connection to the contact pads of the chip.

In an embodiment of the method, the holding device and/or the connection device comprise means to position and maintain the connection portions aligned with connection pads during the connection step.

In an embodiment of the method, the embedding step comprises a hot press step to completely embed the wire inside the support layer.

In an embodiment of the method, the holding device maintains the chip in place by vacuum.

In an embodiment of the method, all the connection pads of a chip are connected to the wire antenna simultaneously.

In an embodiment of the method, the simultaneous connections are achieved by one single compression head which is broad enough to cover all connection pads of the chip.

In an embodiment of the method, a plurality of functional inlays are manufactured simultaneously, as the support layer is a large format comprising a plurality of positions for a plurality of embedded antenna wires to be connected to a plurality of chips.

In an embodiment of the method, the holding device comprises a plurality of positions to hold a plurality of the chips to be connected to a plurality of the antennas.

In an embodiment of the method, the holding device is formed by a vacuum plate comprising multiple sucking holes so that the multiple chips are maintained in position by vacuum. The vacuum plate is being movable at least in a direction perpendicular to the processing path of the support layer.

In an embodiment of the method, the connection device comprises a plurality of connection heads to connect simultaneously a plurality of the chips to a plurality of the antennas.

BRIEF DESCRIPTION OF THE DRAWINGS

The present invention will be better understood from the following detailed description and of the following drawings which show

DETAILED DESCRIPTION

Figure 1:
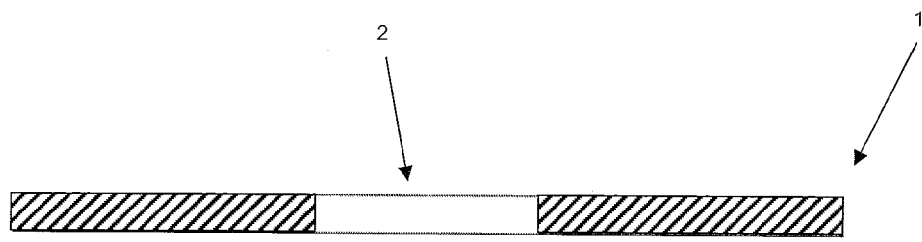
FIG. 1 illustrates a side cut-view of a support layer that is used in the present invention.

A typical support layer is illustrated in FIG. 1, with the reference 1. This layer is for example a 150 µm layer of PC as used in the field of RFID cards and applications. Other similar or equivalent layers (with other sizes and/or made of other materials) may of course also be used in the frame of the present invention.

This layer may comprise a hole or opening 2 at the place where a chip will be deposited, as will be apparent from the following description.

Figure 2:
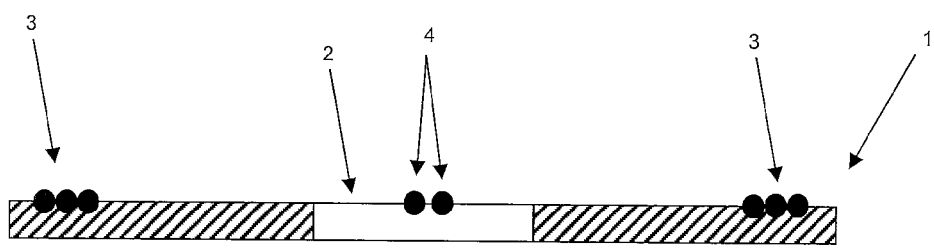
FIG. 2 illustrates the support layer of FIG. 1 on which a wire (typically a wire antenna) has been embedded.
Figure 3:
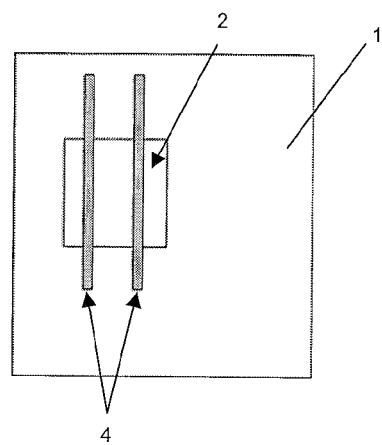
FIG. 3 schematically illustrates a top view of the support layer of FIG. 2.

In order to build a functional inlay, firstly an antenna is formed on the support layer 1. This antenna is preferably a wire antenna 3, and the two ends 4 of the wire antenna 3 pass over the opening 2 (when present in the layer) as illustrated in FIGS. 2 and 3 (FIG. 3 only showing the ends passing over the hole 2 and not all the turns of the wire building the antenna, as is known in the art of RFID devices).

Figure 4:
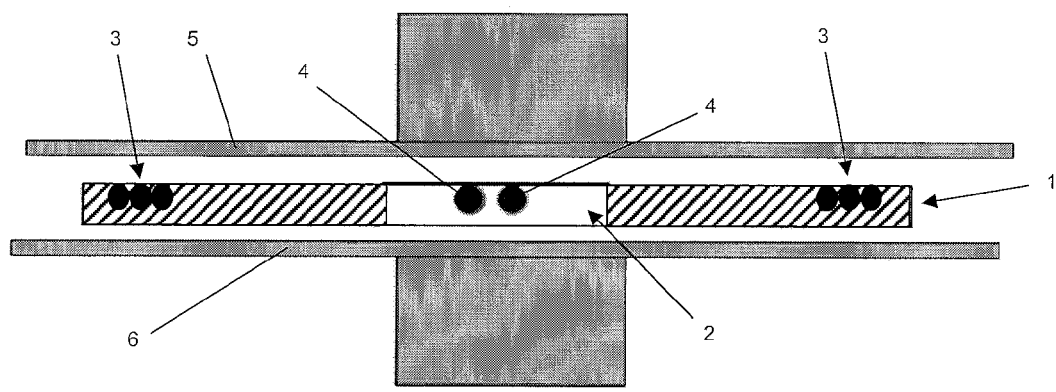
FIG. 4 illustrates an optional schematical view of the wire embedding of the support layer of FIG. 2.

FIG. 4 illustrates an optional method step in which a hot pre-press is applied to the support layer 1 with the wire 3 in order to fully embed the wire 3 in the support layer 1. This step is accomplished with two heated plates 5 and 6 and has the result of entirely embedding the wire antenna 3 in the substrate forming the support layer 1. The purpose of this optional step is double:

1. achieve a final functional inlay as thin as possible. The ideal theoretical thickness corresponding to the thickness of the chip plus the one of the ends portions 4 of the wire (see also FIG. 9 for the final result).
2. be sure to get the complete antenna at the same level inside the support layer (included the two end of the antenna) in order to facilitate the further steps if needed.

Figure 5:
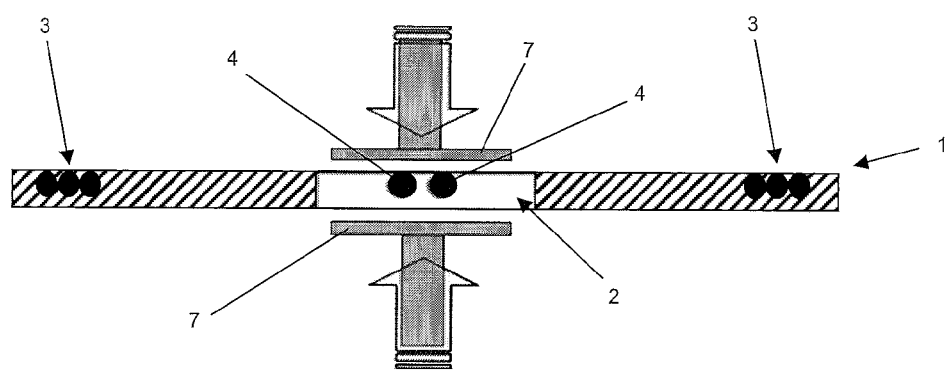
FIG. 5 illustrates an optional schematical view of a wire flattening step.
Figure 6:
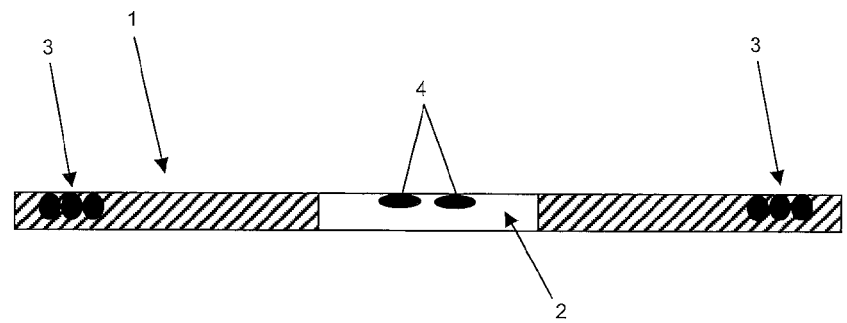
FIG. 6 illustrates schematically the result of the flattening step of FIG. 5.

FIG. 5 illustrates another optional step in the method of the invention, wherein the parts 4 of the wire which are used for the connection to the chip are flattened before the connection step. This system uses at least one pressure plate 7 (preferably two) which press the parts 4 of the wire antenna 3 which are used for the connection to the chip contacts to flatten said parts 4. The result of this flattening operation is illustrated in FIG. 6. The purpose of this optional step are to reduce the thickness of the resulting inlay (as the one illustrated at the FIG. 4), and also to obtain a larger and flat conductive surface to facilitate the connection to the chip pads.

Figure 7:
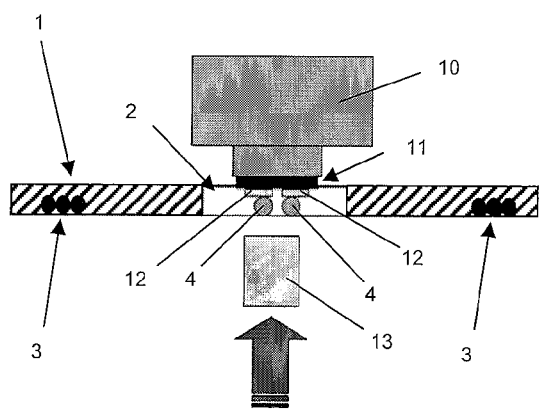
FIGS. 7 and 8 illustrate the deposition of a chip according to the present invention in two variants.
Figure 8:
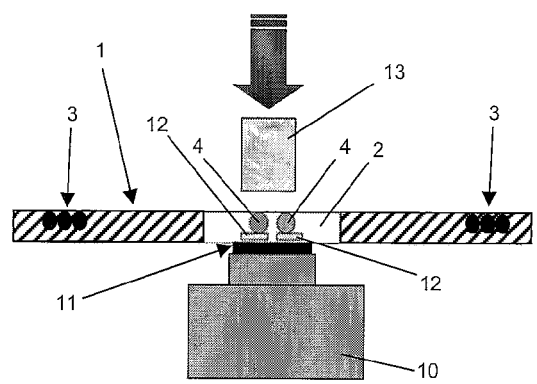

FIGS. 7 and 8 illustrate the principle of the method of the invention for attaching a chip (or chip module) to the wire antenna applied to the support layer 1. Once the antenna wire 3 has been applied to the support layer 1 (see above description), it is transferred to a bonding station. There, the said support layer 1 is approached on one side by a holding device 10 (such as a holding head) which holds a chip 11 whereby said chip comprises connection pads 12 and approached on the other side by a connection device 13. In order to effect the connection between the connection pads 12 and the parts 4 of the wire used for connection, both the holding device and the connection device apply a reciprocal pressure to the wire 4 and the chip 11. Typically, the connection is realized by thermo-compression or thermo-welding. As an example, the connection device 13 may be made of a diamond head or another appropriate and equivalent head and material.

As is illustrated, the chip and the holding device can be brought from either side of the support layer 1. By any other configuration is possible, for example the support layer 1 being vertical and the pressure axes of the devices 10 and 13 being horizontal.

Advantageously, if the connection head 13 is broad enough to cover the two pads 12 at the same time, the wires 4 may be connected simultaneously to the pads 12 of the chip 11. But a two step bonding sequence is also an affordable solution.

A feature of the invention is to have the welding made on the chip holding device, but with the two tools (connection device & holding device) positioned on the two side of the substrate carrying the wire. The key point being that all elements have to be correctly aligned such that the two wire portions 4 can welded to the chip pads 12.

Optionally, wire positioning means could be mounted on either the holding device or the connection device in order to allow a fine adjustment of the wire portions position/orientation. For example, the principle exposed in PCT application WO 2008/114091 (the content of which is incorporated by reference in the present application) could be used here to properly position the wire parts 4 over the connection pads of the chip. Naturally, any other wire gripping means or wire guiding means as known in the art are also applicable.

As an example, the connection device 13 may be made of a diamond head or another appropriate and equivalent head and material.

Figure 9:
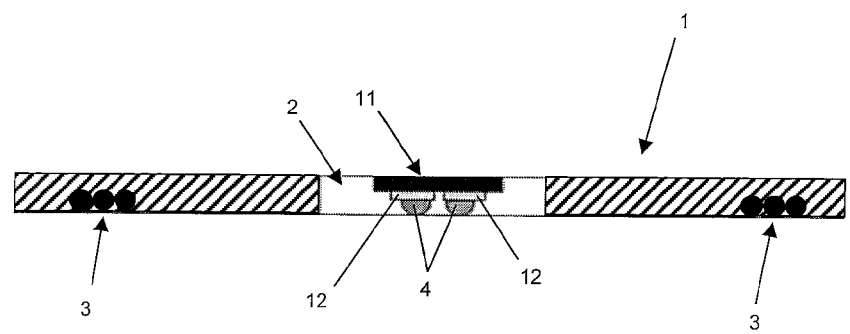
FIG. 9 illustrate the result of the deposition step of FIG. 7 or 8.
Figure 10:
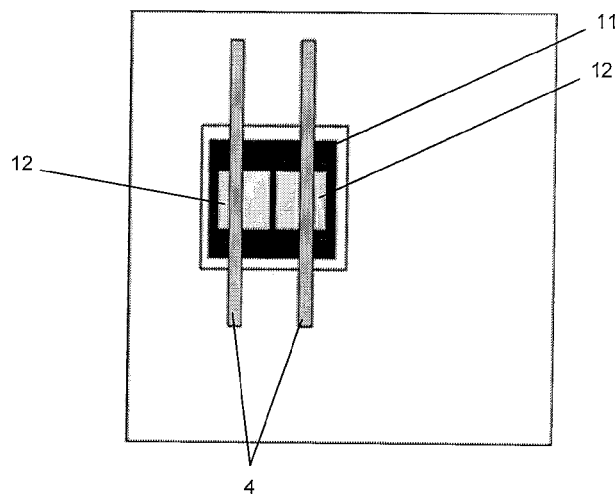
FIG. 10 illustrates a top view of FIG. 9.

FIGS. 9 and 10 illustrate the result of the connection operation as explained with reference to FIGS. 7 and 8.

Specifically, FIG. 9 illustrates a functional inlay produced with the method of the present invention, in lateral cut-view and FIG. 10 illustrates the same result in a top view. In this figure, for the sake of simplicity, the antenna wire is only schematically represented without all the wire turns that normally form the antenna, as is obvious for a person skilled in the art.

As discussed above (see the description of FIG. 4), the resulting inlay has a thickness corresponding to the thickness of the chip plus the one of the ends portions 4 of the wire. For example, the chip P60D144 VA of NXP showing a total thickness (including bump thickness) of 87 µm, and the wire ends 4 being slightly flattened (from 80 µm to about 60 µm) during the compression bonding step, the deliverance of an approximately 150 µm thin RFID inlay can be expected. And even thinner inlays could be produced if the flattening step of FIG. 5 is used.

Figure 11:
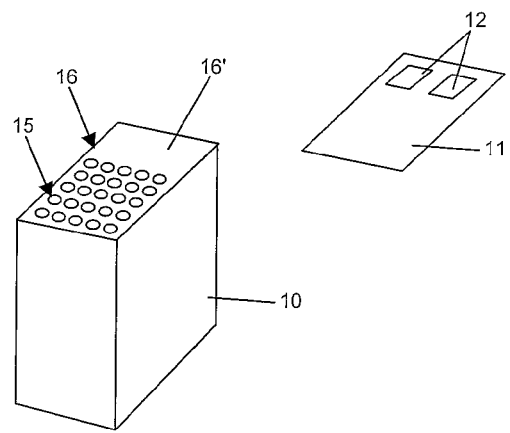
FIG. 11 illustrate an embodiment of a holding head according to the present invention.

FIG. 11 illustrates an exemplary detail of a holding device 10 of the chip. In this example, the holding device 10 uses vacuum to hold the chip 11, the said vacuum being applied through holes 15 opening in the top surface 16 of the holding device 10. Preferably, the surface 16 contains no aspiration holes in the zone 16' where the contacts 12 (or megabumps) of the chip 11 will be placed when the chip is held by the holding device to provide a stable support surface and a good welding.

Typically, the holding device is made of metal or ceramic. The use of such vacuum holding system is particularly recommended for very thin chip as the P60D144 VA of NXP as a mechanical pressure exerted on the chip edge is at risk (of breaking the chip).

Figure 12:
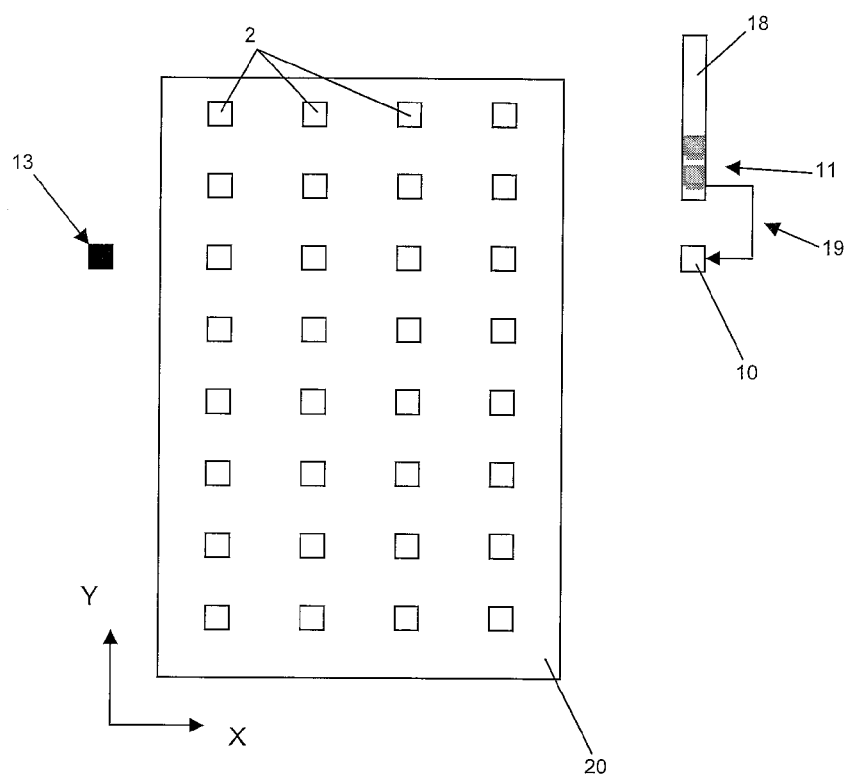
FIG. 12 illustrates a schematical view of an embodiment of a system for carrying out the method of the present invention.

FIG. 12 illustrates a top view of the system used to form the inlay according to the invention. Reference 18 illustrates a feeder which is used to feed the system with individual chips 11 to be applied to the inlay. For example, each chip may be taken from the feeder 18 via a pick and place system 19 and deposited on the surface 16 of a holding device 10. Preferably, the proper positioning and alignment of the chip 16 with the holding device 10 can be achieved with the help of a camera vision control system. Next to the holding device 10, there is a sheet 20 forming the support layer which comprises several embedded antennas and a series of holes 2 as described hereinabove (in the present case 4×8 holes) which correspond to the antennas applied to the support layer 1.

The sheet 20 may be cut later, after the embedding of the antennas and the application of the chips, into individual functional inlays as will be described hereunder. The number of individual inlays produced from a sheet 20 can be varied considering the size of the sheet 20 and the size of an individual inlay 1. FIG. 12 illustrates an 8×4 configuration but of course other configurations are possible in the frame of the present invention.

Once a chip 11 has been picked and placed on a holding device 10, said device may be moved in X, Y and Z directions (Z being perpendicular to the X,Y axis illustrated in FIG. 12), to the right position on the sheet 20 for placing the chip 12 as illustrated in FIGS. 7 and 8 and discussed above. At the same time, the connection device 13 is moved to the same position on the other side of the sheet 20 for cooperation with the holding device 10 and carrying out of the method steps of the invention. The connection device may also move in X, Y and Z directions to this effect.

When a chip 11 is being connected to an antenna 3, it is important to ensure that the chip 11 is properly positioned and that the pads 12 are at the right position with respect to the wire portion 4 of the antenna that are used for the connection.

To this effect, an adjustment system is used to ensure a right alignment and possibly correct the relative position of the chip. The system may uses for example the X, Y positioning of the device 10 and 13 coupled for example to a vision system (camera) to this effect, the Z degree of freedom (vertical) being used to apply the reciprocal pressure between the holding device 10 and the connection device 13.

Alternatively, the positioning of the sheet 20 can also be controlled in the X-Y plane. In such a configuration, the connection device 13 need only to be movable along the Z directions (to achieve the bonding pressure) and the holding device will have come to a fix position bonding position (defined in regards of the X-Y fixed connection device 13).

Chips 11 may be applied sequentially, one chip 11 after the other, or several chips 11 may be applied at the same time, for example line by line. The holding device 10 and connection device 13 are adapted in consequence with a single head on each side (sequential application) or several heads (parallel application), the number and relative positions of the heads being of course adapted to the sheet 20 configuration and to the size of the chips 11.

Figure 13:
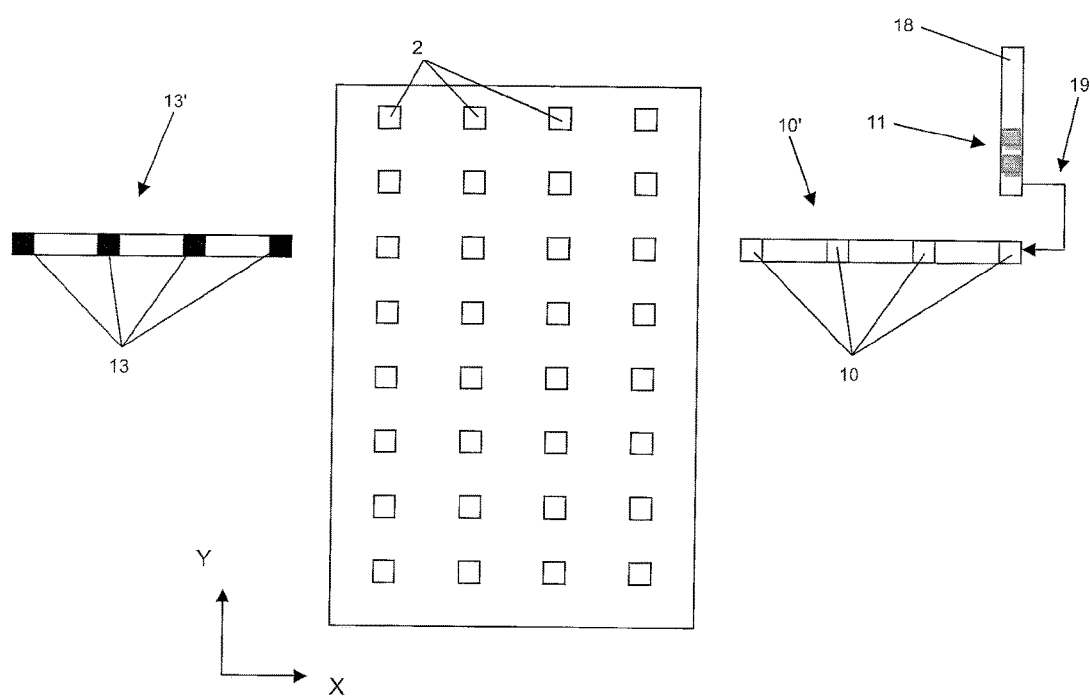
FIG. 13 illustrates a schematical view of another embodiment of a system for carrying out the method of the present invention.

A parallel-working machine is illustrated in FIG. 13 as an example. In this example, one uses an inline holding device system 10' with four heads 10 and a corresponding inline connection device system 13' with four connection heads 13. This is only an example and the inline system may for example comprise another number of heads, for example two or more, or even as much as the number of inlays to be produced from the sheet 20.

Only one feeder 18 is illustrated for placing a chip on each holding device via the pick and place system 19, but it is possible to use more than one such feeder 18, for example two or four to place a chip on each device 10 in parallel (four at a time) or in parallel and sequence (two and two). Of course, the choice may be varied according to circumstances and to the number of holding devices/heads.

In one embodiment, when the chips 11 are applied individually, this position adjustment may be controlled just before the reciprocal pressure of the devices 10, 13 is applied to the chip 11 and wires 4.

In another embodiment, in case of parallel application of chips 11, the adjustment may be made at the same moment, but each device 10 is controlled individually and adjusted if necessary so that the chips are correctly positioned before the pressure is applied. Preferably, in such configuration, each head of the device 10 is coupled to a measurement system, for example an optical system (camera) to allow the said adjustment to take place.

In a further embodiment, especially useful when several chips 11 are applied in parallel, one may firstly determine each antenna position on the sheet 20 or of each opening 2 (if present) for example via optical means (i.e. a camera) and once these positions are known, place the chips 11 at a corresponding position on the holding devices 10. This construction could be used if the heads of the holding device 10 are fixed relatively to each other, a position adjustment being made at the level of the individual chip 11 on the heads. The holding device can also be made of one elongate vacuum plate, as the one of FIG. 11 but much larger and with the possibility to place the chips at convenience (no fixed positions). Alternatively, the relative position adjustment may be made between each head of the device 10 (and 13)

once the chips are held by the holding heads but before the reciprocal pressure is applied in accordance with the method of the present invention.

Figure 14:
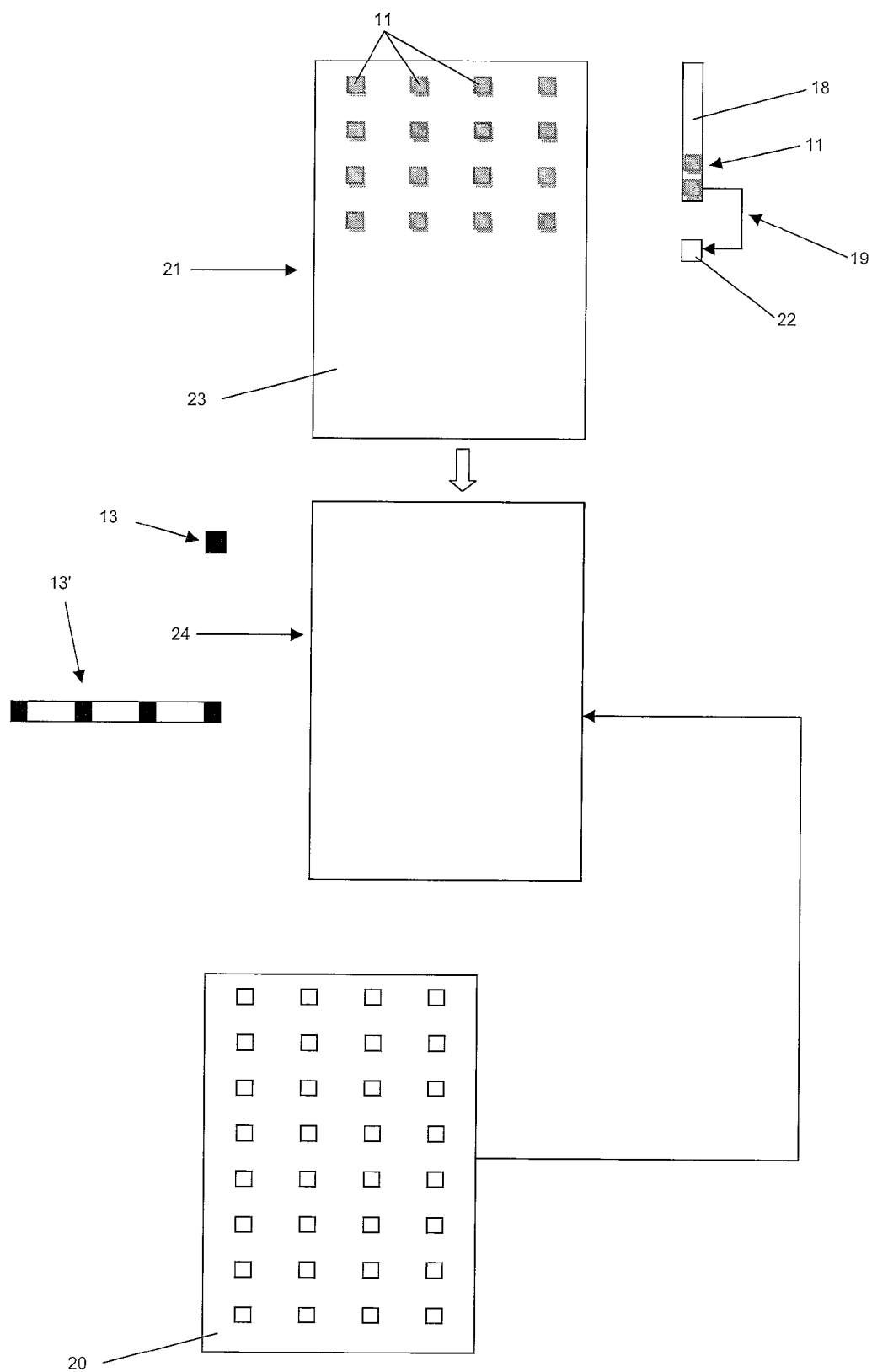
FIG. 14 illustrates a schematical view of another embodiment of a system for carrying out the method of the present invention.

FIG. 14 illustrate a further embodiment of a simultaneous parallel application of chips in a bonding station. More specifically, reference 21 identifies a chip 11 placement area or station on which a pick and place tool 22 position individual chips taken from a feeder 18. The position of each chip could be determined previously from the sheet 20 which carries the embedded antennas 3 and may also contain the holes 2. This determination could be made for example by way of optical means (camera for example). Once the positions of the antennas are known, it is possible via the pick and place tool 22 to deposit each chip 11 at a corresponding position in the chip placement area 21, on a rigid vacuum plate 23 for example made of metal or ceramic. In this embodiment, the support 23 plays the role of the holding device 10 described previously, but this holding device carries here a plurality of chips 11.

Once the desired number of chips 11 has been placed on the plate 23, the plate 23 in then moved along a processing path to a bonding area or station 24 to which a sheet 20 with the antennas is brought is also processed for application and connection of the chips 11 to the antennas 4 according to the principle of the present invention as described herein.

Each chip 11 may be individually sequentially bonded to the antenna 4 by using a connection device 13 (see the principle exposed in relation to FIGS. 7 and 8) or it is possible to have a parallel procedure where plurality (i.e. more than one) chip is connected to an antenna. In such case, there are also a plurality of connection heads (reference 13' in FIG. 14) working in parallel.

The number of connection heads may be equal to the number of chips to be placed on one sheet 20, such that the connection of the chips to the antennas may be made in one single process step.

Figure 15:
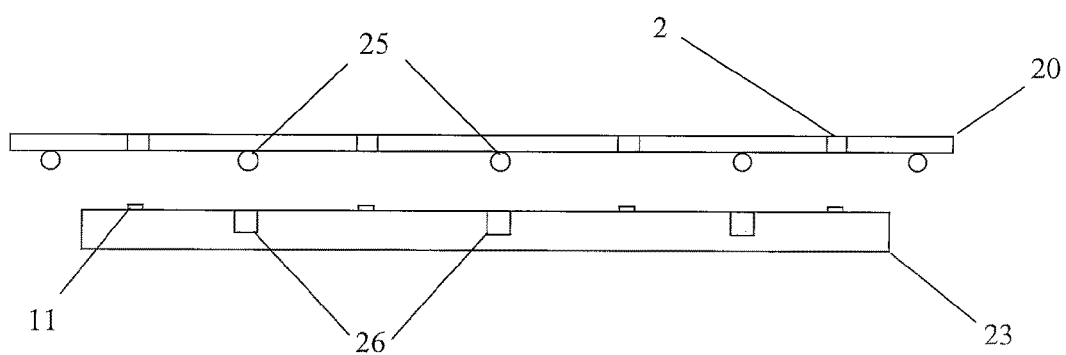
FIG. 15 illustrates a side view showing how to handle an embodiment of the invention.

Note that an issue to the application of such a large holding plate 23 is that support bars 25 as shown in FIG. 15 are needed in order to maintain the support sheet 20 horizontal. A possible solution is to create grooves 26 corresponding to the support bars in the plate 24, such that when the holding plate is approached near of the support sheet 20, the support bars will enter in the grooves 26 without blocking the movement of the plate 23.

Once the chips are connected to the antennas, the sheet 20 is then transported to another area or station for further treatment, for example for the cutting of individual functional inlays.

The entire system is preferably monitored by a computer system and appropriate programs that are able to carry out the method. Typically, such computer means and programs will manage and run the method steps, at least for example the feeding of sheets 19 and chips 11, the chip placement on the holding heads 10 with control of the vacuum, the moving of the heads at the right position on the sheets, the adjustment of the positioning (via dedicated means such as cameras) of the chips 11 and the connection step per se with the reciprocal pressure being applied and the further processing steps of the inlays produced by the method, for example moving in a cutting station where the individual inlays are produced by cutting the sheet 20 into such individual inlays.

Of course, all the methods and embodiments described herein are to be regarded as illustrative examples and not construed in a limiting manner. Modifications are possible within the scope of the present invention, for example by use of equivalent means and method steps. In addition, different embodiments described herein may be combined together according to circumstances.

The invention claimed is:

1. A method of manufacturing a functional inlay comprising:
    a. providing a support layer with at least a first and a second side;
    b. embedding a wire antenna in said support layer;
    c. transferring said support layer with said embedded wire antenna to a connection station;
    d. at said connection station, approaching said support layer on said first side by a holding device holding a chip with a surface comprising connection pads;
    e. at said connection station, approaching said support layer on said second side by a connection device; and
    f. connecting said antenna wire to said connection pads by means of a reciprocal pressure exerted between said holding device and said connection device.

2. The method as defined in claim 1, wherein the support layer with the wire embedded antenna is processed along a processing path and the holding device and the connection device both approach the support layer by movements essentially perpendicular to said processing path.

3. The method as defined in claim 1, wherein the connection step is achieved by thermo-compression.

4. The method as defined in claim 1, wherein the support layer comprises a through hole in which the chip is positioned by the holding device during or shortly before the connection step.

5. The method as defined in claim 4, wherein connection portions of the wire antennas dedicated to be connected to the connection pads of the chip are positioned over said through hole.

6. The method as defined in claim 5, wherein the connection portions of the wire antenna are positioned over the said through hole during the wire antenna embedding step.

7. The method as defined in claim 5 comprising an additional step to reposition the said connection portions of the wire antenna over the said through hole after the wire embedding step and before or during the connection step with a chip.

8. The method as defined in claim 5, wherein the connection portions undergo a flattening step before the connection step to the chip to provide a larger and substantially flat conductive area for connection to the contacts of the chip.

9. The method as defined in claim 5, wherein the holding device and/or the connection device comprise means to position and maintain the connection portions aligned with connection pads during the connection step.

10. The method as defined in claim 1, wherein the embedding step comprises a hot press step to completely embed the wire inside the support layer.

11. The method as defined in claim 1, wherein the holding device is maintaining the chip in place by vacuum.

12. The method as defined in claim 1, wherein all the connection pads of the chip are connected to the wire antenna simultaneously.

13. The method as defined in claim 12, wherein said simultaneous connections are achieved by one single compression head which is sized to contact all connection pads of the chip.

14. The method as defined in claim 1, wherein a plurality of functional inlays are manufactured simultaneously, as the support layer is a large format comprising a plurality of positions for a plurality of embedded antenna wires to be connected to a plurality of chips.

15. The method as defined in claim 14, wherein the holding device comprises a plurality of positions to hold a plurality of the chips to be connected to a plurality of the antennas.

16. The method as defined in claim 15, wherein the holding device is formed by a vacuum plate comprising multiple sucking holes so that the multiple chips are maintained in position by vacuum.

17. The method as defined in one of claim 14, wherein connection device comprises a plurality of connection heads to connect simultaneously a plurality of the chips to a plurality of the antennas.

18. A functional inlay made by the method according to claim 1.

19. A method of manufacturing a functional inlay comprising:
   a. providing a support layer with at least a first and a second side;
   b. embedding a wire antenna in said support layer;
   c. transferring said support layer with said embedded wire antenna to a connection station;
   d. at said connection station, moving a holding device holding a chip with a surface comprising connection pads to said first side of the support layer;
   e. at said connection station, moving a connection device to said second side of said support layer; and
   f. connecting said antenna wire to said connection pads by means of a reciprocal pressure exerted between said holding device and said connection device.

* * * * *